United States Patent [19]

McClure et al.

[11] Patent Number: 5,574,688
[45] Date of Patent: Nov. 12, 1996

[54] APPARATUS AND METHOD FOR MAPPING A REDUNDANT MEMORY COLUMN TO A DEFECTIVE MEMORY COLUMN

[75] Inventors: David C. McClure, Carrollton; Thomas Teel, Austin, both of Tex.

[73] Assignee: SGS-Thomson Microelectronics, Inc., Carrollton, Tex.

[21] Appl. No.: 438,903

[22] Filed: May 10, 1995

[51] Int. Cl.$^6$ ............................................. G11C 13/00
[52] U.S. Cl. ............................................. 365/200; 365/203
[58] Field of Search ................................ 365/200, 189.01, 365/230.01, 203

[56] References Cited

U.S. PATENT DOCUMENTS

| | | | |
|---|---|---|---|
| 3,900,837 | 8/1975 | Hunter | 365/200 |
| 4,471,472 | 9/1984 | Young | 365/200 |
| 4,601,019 | 7/1986 | Shah et al. | 365/200 |

*Primary Examiner*—Terrell W. Fears
*Attorney, Agent, or Firm*—David V. Carlson; Theodore E. Galanthay; Lisa K. Jorgenson

[57] ABSTRACT

A memory device, which communicates with external address and data buses, includes a circuit for mapping a redundant memory column having a redundant memory cell to an address of a defective memory column. An enable line communicates with the redundant memory column and selectively carries active and inactive signal levels for respectively enabling and disabling communication between the data bus and the redundant memory cell. An address decoder receives an address signal on the address bus and generates the active level on the enable line when the value of the address signal equals the address of the defective memory cell. A driver precharges the enable line to the inactive level while the address signal is invalid.

31 Claims, 6 Drawing Sheets

APPARATUS AND METHOD FOR MAPPING A REDUNDANT MEMORY COLUMN TO A DEFECTIVE MEMORY COLUMN

CROSS-REFERENCE TO RELATED APPLICATION

The present application is related to pending U.S. patent application Ser. No. 08/438,349, entitled "APPARATUS AND METHOD FOR MAPPING A REDUNDANT MEMORY COLUMN TO A DEFECTIVE MEMORY COLUMN," by David C. McClure and Thomas Teel, which was filed concurrently herewith and, which is incorporated herein by reference.

TECHNICAL FIELD

The present invention relates generally to electronic devices and more particularly to a device for mapping a redundant column of memory cells to the address of a defective column of memory cells.

BACKGROUND OF THE INVENTION

Many memory devices, both volatile devices such as Random Access Memories (RAM) and nonvolatile devices such as Electrically Programmable Read-Only Memories (EPROM), include extra, i.e., redundant, memory cells that can be substituted for defective memory cells in the memory-cell array. Typically, such memory devices have their memory cells, both array and redundant, arranged in rows and columns. Because each memory cell is located at the intersection of a particular row and column, external circuitry addresses a memory cell by addressing both its row and column. The use of redundant memory cells often renders usable a memory device having one or more defective array memory cells, which otherwise would render the memory device unusable.

Typically, when a testing apparatus discovers a defective memory cell during initial testing of the memory-cell array, the testing apparatus configures a circuit within the memory device to map a column of redundant memory cells, i.e., a redundant column, to the address of the column containing the defective memory cell, i.e., the defective column. That is, when a cell within the defective column is addressed, the circuit enables the corresponding memory cell within the redundant column for data transfers intended for the defective cell. The same or another circuit typically disables the defective column to prohibit data transfers thereto or therefrom.

It is often desirable that the cells within a redundant column have access times at least as fast as the cells of the array columns. That is, it is desirable that the use of a redundant column incur no speed penalty for the memory device. It is also desirable that the memory device have good mapping flexibility. That is, it is desirable that the mapping circuit be able to map a particular redundant column to one of as many array columns as possible.

In some memory devices, however, the redundant columns are located such that the access times of their cells are significantly greater than the access times of the cells of the array columns. That is, because its access speed is slower, the use of a redundant column incurs a speed penalty for these memory devices. Thus, the specified access speed (i.e., the access speed specified on the device data sheet) of these devices often is reduced to accommodate the use of one or more redundant columns.

In other memory devices, the redundant columns are located such that the access times of their cells are approximately equal to the access times of the array cells. However, such location may increase the device's layout complexity, layout area, or number of components (such as transistors). Furthermore, such location may decrease the devices' mapping flexibility, i.e., may limit the number of redundant columns that can be mapped to a particular array column if it is defective.

SUMMARY OF THE INVENTION

In accordance with an aspect of the present invention, a memory device, which is in communication with an external address bus and an external data bus having one or more data lines, includes a circuit for mapping a redundant memory column having a redundant memory cell to an address of a defective memory column. An enable line communicates with the redundant memory column and selectively carries first active and inactive signal levels for respectively enabling and disabling communication between the data bus and the redundant memory cell. An address decoder receives an address signal and generates the active level on the enable line when the value of the address signal equals the address of the defective memory cell. A first driver precharges the enable line to the inactive level while the address signal is invalid.

In another aspect of the invention, a redundant data bus communicates with the redundant memory column. An interface circuit communicates with the enable line and the external and redundant data busses. In response to the active level on the enable line, the interface circuit couples the memory location to a desired one of the data-bit lines via the redundant data bus.

In yet another aspect of the invention, a bit-select bus is provided having one or more bit-select lines each associated with one of the data-bit lines of the external data bus. Each of the bit-select lines selectively carries second active and inactive levels. A data-bit line selector generates the second active level on a bit-select line associated with the desired data-bit line in response to a first active level on the enable line. The first or a second driver precharges the bit-select lines to the second inactive level when the address signal is invalid.

An advantage of one aspect of the present invention is a reduction in the area of a memory device having redundant memory columns without incurring a speed penalty associated with the access of a redundant memory cell.

An advantage of another aspect of the present invention is reduction of the memory device's layout complexity without incurring a speed penalty.

An advantage of still another aspect of the invention is an increase in a memory device's mapping flexibility without incurring a speed penalty and with a reduced layout complexity and area.

An advantage of yet another aspect of the invention is a reduction in the number of integrated circuit elements, such as transistors, that compose the memory device.

DETAILED DESCRIPTION OF THE INVENTION

Figure 1:
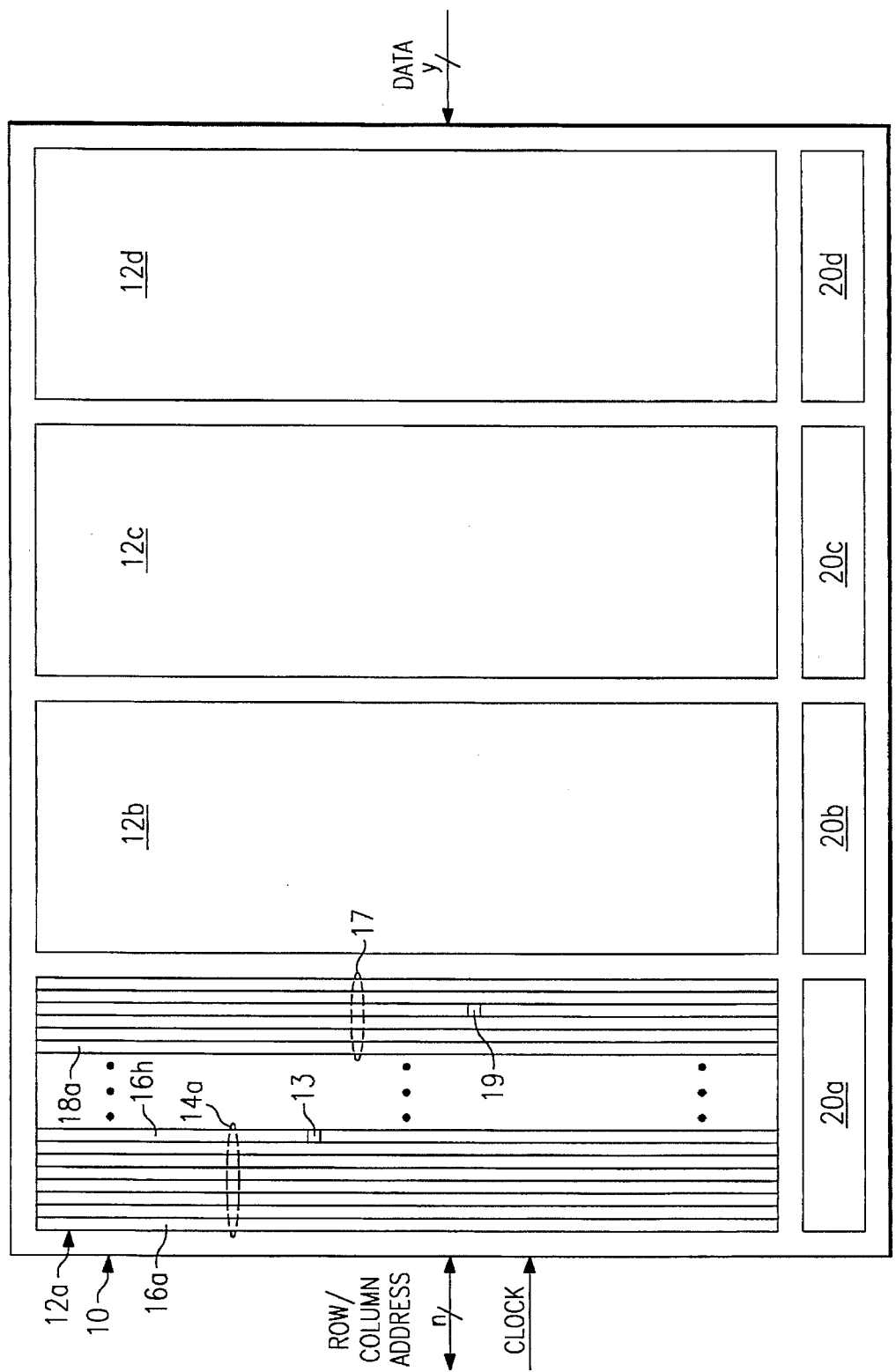
FIG. 1 is a block diagram of a memory device according to the present invention.

FIG. 1 is a block diagram of a memory device 10 according to the present invention. In one aspect of the invention, memory device 10 is a synchronous 1-megabit burst RAM providing a y=18-bit external data bus DATA(0–y). A burst RAM is a memory device that can operate in a burst mode. While operating in burst mode, external circuitry (not shown) supplies memory device 10 with a starting address. Beginning with this starting address, device 10 uses an internal counter (not shown) to access sequential memory locations. Thus, a memory device 10 operating in burst mode can often read and write data much faster than memory devices that require the external circuitry to provide a new address for each memory access. In another aspect of the invention, which is described herein for clarity, memory device 10 is a synchronous 1-megabit RAM providing a y=16-bit bus DATA (0–y). Although memory device 10 is disclosed as a RAM device, the present invention contemplates other memory devices such as EPROMS (electrically programmable read-only memories) or EEPROMS (electrically erasable and programmable read-only memories).

Memory device 10 is typically a synchronous device, i.e., receives a clock signal as shown in FIG. 1. Thus, device 10 reads the n-bit address signal on the ADDRESS bus at a specific time, for example, on the rising or falling edge of the CLOCK signal. That is, the address signal is "valid," i.e., accurate, at the selected edge of each clock pulse, and a predetermined interval thereafter. At all other times, the address is considered "invalid", i.e., inaccurate. Often, the address signal comprises two components: an n/2-bit EXTERNAL COLUMN ADDRESS to select a desired column (or redundant column if the desired column is defective), and an n/2-bit EXTERNAL ROW ADDRESS to select the desired memory cell within the desired column (or a redundant cell in the redundant column). Typically, both COLUMN and ROW addresses are received in parallel, i.e., at substantially the same time, on the same n-bit ADDRESS bus as shown in FIG. 1. In another aspect of the invention, however, the column and row addresses may be received serially on an n/2-bit ADDRESS bus.

The array memory cells 13 of memory device 10 are arranged in memory blocks 12, memory subblocks 14, and memory columns 16. In one aspect of the invention, memory device 10 includes four blocks 12a–d, each block 12 having four subblocks 14a–d, each subblock 14 having eight columns 16a–h. Although shown arranged as four adjacent rectangles, blocks 12 may be arranged as four quadrants or in other layouts without departing from the spirit and scope of the invention.

Typically, each block 12 provides a fraction of the total number of cells 13 that collectively form the y-bit word that each external address signal on the ADDRESS bus accesses. For example, in the 16-bit device shown, block 12a may provide for each y-bit word the four memory cells 13 corresponding to the four external data-bit lines DATA(0–3), block 12b the cells 13 corresponding to external bit lines DATA(4–7), block 12c the cells 13 corresponding to external bit lines DATA(8–11), and block 12d the cells 13 corresponding to external bit lines DATA(11–15). However, the cells 13 of a particular block 12 need not correspond to the same external data-bit lines for each word. In an 18-bit device 10, such as the burst RAM discussed above, for each 18-bit word, two of the blocks 12 each provide five cells 13, and the remaining two blocks 12 each provide four cells 13.

Each block 12 also includes a bank 17 of one or more redundant memory columns 18, which each include one or more redundant memory cells 19. Redundant columns 18 can replace any columns 16 that are found to be defective during the initial factory testing of memory device 10. As discussed further below in conjunction with FIGS. 2–11, the testing apparatus programs a redundant-column mapping circuit 20 to map a selected redundant column 18 to the n-bit address of a defective column 16. This mapping is typically permanent for the life of device 10, and is transparent to the addressing and other circuitry (not shown) external to device 10. That is, the external circuitry still provides the same address for the defective column 16, and circuit 20 automatically reroutes any data communications intended for the defective column 16 to the selected redundant column 18.

In one embodiment of the invention, each bank 17 of columns 18 is associated with a circuit 20. Although in this embodiment of the invention, each bank 17 is physically located within or adjacent to a particular block 12, the circuits 20 can be designed to map any associated redundant column 18 to any column 16 in the same or another block 12. Thus, as discussed further below, circuits 20 often increase the flexibility of redundant-column mapping in memory device 10 without incurring a speed penalty, and with a reduction in the layout complexity and area and in the number of circuit elements. Furthermore, although shown adjacent or within blocks 12, redundant columns 18 may be located in one area of memory device 10 and not distributed among blocks 12. In such an embodiment, there may be only one circuit 20.

Figure 2:
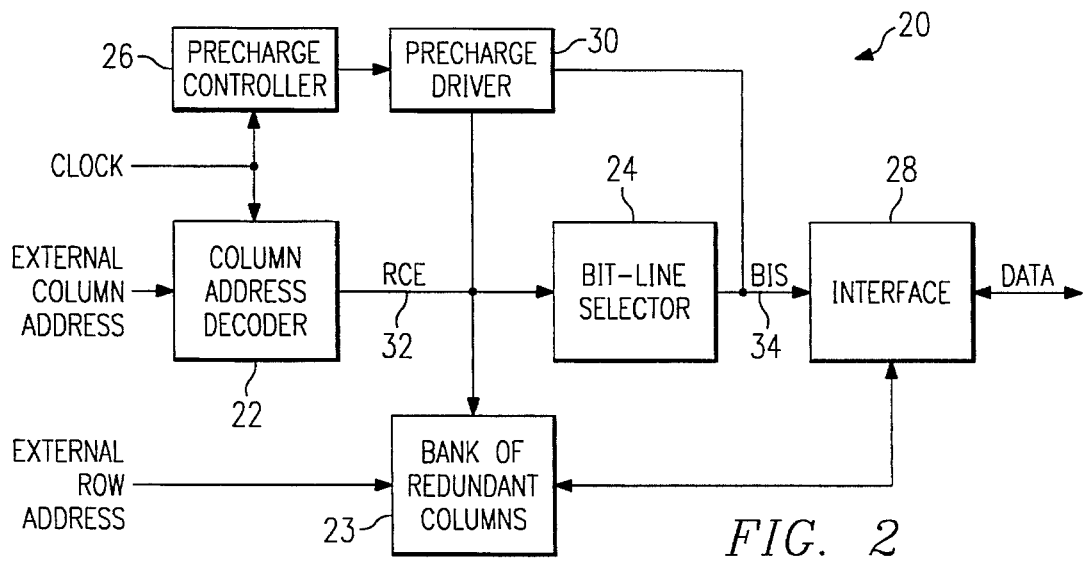
FIG. 2 is a block diagram of a redundant-column mapping circuit of FIG. 1.

FIG. 2 is a block diagram of one embodiment of a circuit 20 from FIG. 1. Circuit 20 includes one column address decoder 22 for each redundant column 18 in the redundant-column bank 17 with which it is associated. Circuit 20 also includes a bit-line selector 24, a precharge controller 26, an interface 28, and a precharge driver circuit 30.

In operation, for each n-bit EXTERNAL COLUMN ADDRESS (ECA) provided, decoder 22 determines whether the addressed column 16 is to be replaced with a redundant column 18; if so, interface 28 couples the redundant data bus RDATA to the external data-bit line of DATA(0–y) selected by circuit 24. As discussed above for synchronous devices 10, ECA is valid at a particular edge of the clock pulse. During the preceding interval, which typically begins at the opposite edge of the clock pulse, ECA is typically invalid. During this interval of invalidity, controller 26 signals driver 30 to precharge the redundant column enable (RCE) and bit select (BIS(0–x)) lines 32 and 34 to inactive signal levels (i.e., logic "1" or logic "0", depending upon the design of circuit 20).

If, upon becoming valid, ECA selects a defective column 16, decoder 22 generates on line 32 an active signal level, which enables the corresponding redundant column 18 for data communication, and also causes circuit 24 to generate an active level on the bit-select line of BIS corresponding to a preselected data-bit line of DATA. Interface 28 then couples via RDATA the preselected bit line to the redundant memory cell 19 (in the enabled redundant column 18) selected by the EXTERNAL ROW ADDRESS signal (not shown) to enable the desired data operation, i.e., a read from or a write to memory device 10.

Because line 32 and the lines 34 of BIS are precharged to inactive levels during the relatively long (approximately 10 nanoseconds) interval when ECA is considered invalid, drive circuit 30 can, without incurring a speed penalty, operate more slowly than if precharging were not used. Thus, because it allows a reduction in operating speed, precharging often relaxes the design requirements and reduces the layout complexity associated with redundant columns 18, circuits 20, and the components thereof. The decrease in layout complexity often allows an increase in the mapping flexibility, i.e., allows one to design a circuit 20 to map any associated redundant column 18 to any defective column 16, regardless of the defective column's physical location within device 10, without incurring a speed penalty. Furthermore, the decrease in layout complexity may reduce the size of memory device 10. Moreover, driver 30 reduces the number of circuit elements (not shown), such as transistors, that decoder 22 requires.

In another aspect of the invention, circuit 20 provides one bit-line selector 24 for each redundant column 18, where the bit-line selection outputs from each selector 24 are wired-logic coupled to the lines 34 of BIS. By reducing the routing complexities associated with coupling each RCE line 32 to a central bit-line selector 24, such a provision further reduces the layout complexity of device 10, and in particular, may greatly reduce the area of device 10, without incurring a speed penalty.

Furthermore, although one driver 30 is shown per circuit 20, in other aspects of the invention, device 10 may provide circuits 22 and 24 multiple driver circuits.

Figure 3:
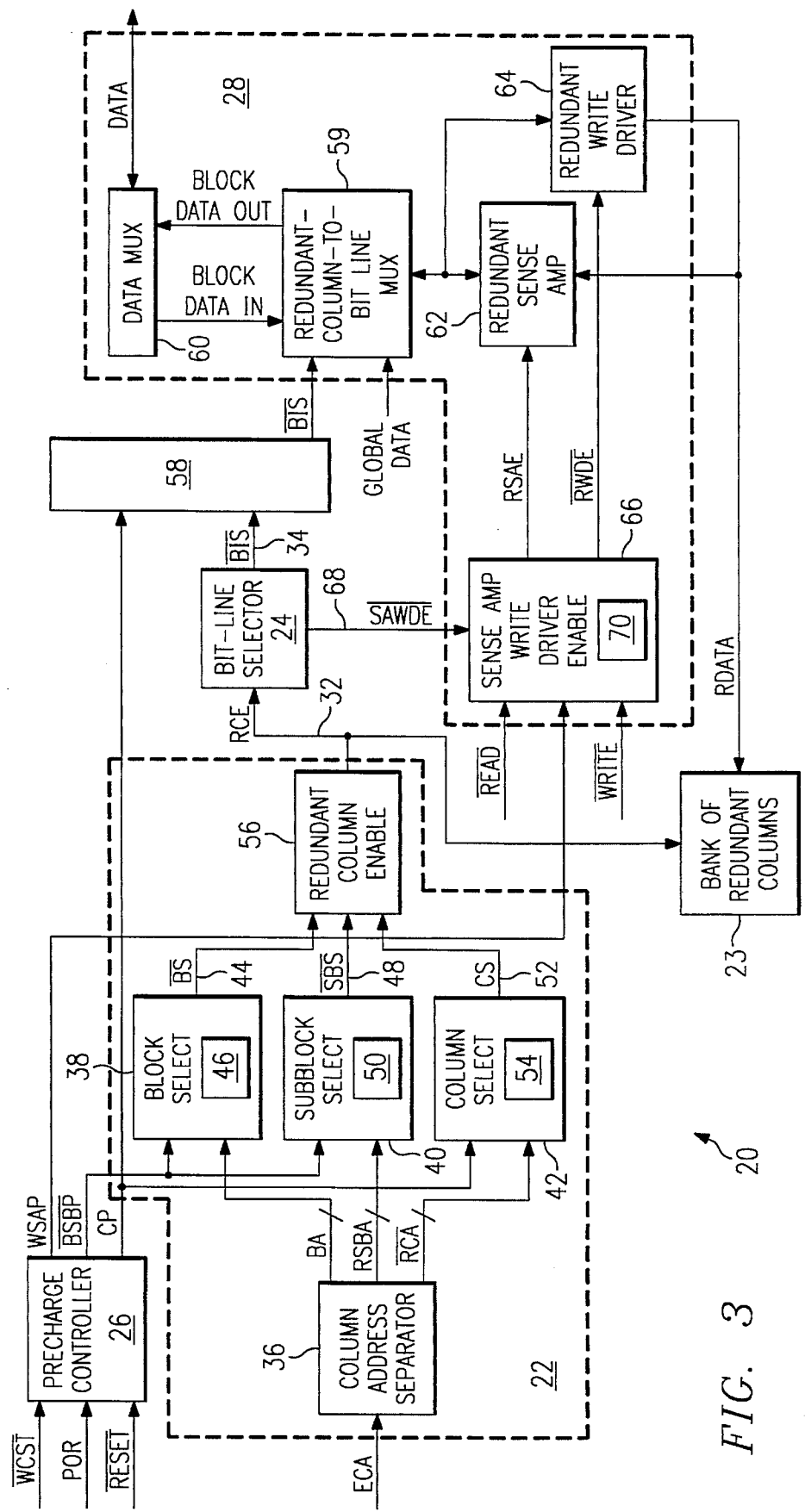
FIG. 3 is a block diagram of the redundant-column mapping circuits of FIGS. 1 and 2 according to another aspect of the invention.

FIG. 3 is a block diagram of another embodiment of a circuit 20 from FIGS. 1 and 2. Each precharge controller 26 receives power on reset (POR), $\overline{RESET}$, and write control strobe ($\overline{WCST}$) signals. $\overline{RESET}$ and $\overline{WCST}$ are derived from the CLOCK signal of FIGS. 1 and 2, and thus provide the address-valid and address-invalid clock intervals to controllers 26. In one aspect of the invention, there is one decoder 22 for each redundant column 18.

Column address decoder 22 includes at least one controller 26, and at least one column address separator 36 for receiving the EXTERNAL COLUMN ADDRESS (ECA) signal and separating it into block address (BA), relative-subblock address (RSBA), and relative-column address ($\overline{RCA}$) signals. Signals BA, RSBA, and RCA are typically invalid when ECA is invalid, and become valid concurrently with or at some time after ECA becomes valid. In one aspect of the invention, signals BA and RSBA include 4 bits, and signal $\overline{RCA}$ includes 8 bits, where each bit of each respective address corresponds to a block 12, a relative position of a subblock 14 within a block 12, and a relative position of a column 16 within a subblock 14. However, the present invention contemplates a circuit 22 that is designed for memories 10 having other numbers of blocks, subblocks within a block, and columns within a subblock.

Decoder 22 also includes a block selector 38, relative-subblock selector 40, and relative-column selector 42 for each redundant column 18 associated with decoder 22. Block selector 38 generates an active level, here a logic 0, on a $\overline{Block\ Select}$ ($\overline{BS}$) line 44 when signal BA indicates that ECA has addressed a predetermined block 12. As discussed below, block selector 38 can be programmed to generate an active level when any desired one of blocks 12 is addressed. Block selector 38 includes a driver 46 for precharging line 44 to an inactive level, here logic 1, during the interval when ECA is invalid. A $\overline{Block\text{-}Subblock\ Precharge}$ ($\overline{BSBP}$) signal, here active low, from controller 26 controls driver Relative-subblock selector 40 generates an active level, here logic 0, on a $\overline{Subblock\ Select}$ ($\overline{SBS}$) line 48 when signal RSBA indicates that ECA has addressed a predetermined subblock position within a block 12. Subblock selector 40 can be programmed to generate this active level when any desired one of the possible subblock positions are addressed. A driver 50, controlled by signal $\overline{BSBP}$ from controller 26, precharges line 48 during the interval when ECA is invalid.

Relative-column selector 42 generates an active level, here a logic 1, on a Column Select (CS) line 52 when signal $\overline{RCA}$ indicates that ECA has addressed a predetermined column position within a subblock 14. Column selector 42 can be programmed to generate this active level when any desired one of the possible column positions are addressed. Column selector 42 includes a driver 54 for precharging CS line 52 to an inactive level, here logic 0, during the address invalid interval. A Column Precharge (CP) signal from controller 26 controls driver 54.

A redundant column enabler 56 is coupled to lines 44, 48, and 52, and generates an active level, here logic 1, on RCE line 32 when lines 44, 48, and 52 concurrently carry their respective active levels. Thus, enabler 56 effectively performs an AND logic function. Furthermore, when lines 44, 48, and 52 are precharged, an inactive level, here logic 0, propagates to line 32; thus, line 32 need not be precharged directly.

Thus, as discussed above, column address decoder 22 enables a predetermined redundant column 18 only when ECA addresses the block 12, the subblock position within the block 12, and the column position within the subblock that the associated defective column 16 occupies.

Bit-line selector 24, in response to an active level on RCE line 32, generates an active level, here logic 0, on the bit-select line 34 of $\overline{BIS}$ corresponding to the bit line of DATA to which the selected redundant column 18 is to be mapped. Typically, one selector 24 is associated with each redundant column 18, and each selector 24 is programmable to map its associated redundant column 18 to any desired bit line of DATA serviced by the circuit 20 that includes the selector 24. For example, circuit 20 of FIG. 3 may service bit lines DATA (0–3).

A driver 58, in response to precharge signal CP, precharges all the lines 34 of $\overline{BIS}$ to inactive levels during the interval when ECA is invalid. Because the outputs of selectors 24 are wired-logic connected to lines 34 of $\overline{BIS}$, each circuit 20 typically includes only one $\overline{BIS}$ bus. Thus, each circuit 20 typically includes only one driver 58. As stated above, such precharging and including one selector 24 for each redundant column 18 often allows circuit 20 to map any associated redundant column 18 to any defective column 16 and to any bit line of DATA that circuit 20 services. Circuit 20 accomplishes this mapping without incurring a speed penalty, with a reduced number of circuit elements, and with an efficient layout that often reduces the size of memory device 10.

Interface circuit 28 includes a redundant-column-to-bit-line multiplexer 59, which in response to an active level on a selected line 34 of $\overline{BIS}$, couples (via a write driver and sense amp respectively, as discussed below) redundant data bus RDATA to a corresponding line of the BLOCK DATA IN bus during a write operation, and to the BLOCK DATA OUT bus during a read operation. A data multiplexer 60 couples the corresponding line of the BLOCK DATA IN or BLOCK DATA OUT busses to the selected bit line of DATA.

During a read operation, a redundant sense amp 62 provides data from the selected redundant memory cell 19 to MUX 59 via RDATA. During a write operation, a redundant write driver 64 provides data from MUX 59 to the selected cell 19 via RDATA. A signal REDUNDANT SENSE AMP ENABLE (RSAE), here active high, enables redundant sense amp 62. A signal $\overline{\text{REDUNDANT WRITE DRIVER ENABLE}}$ ($\overline{RWDE}$), here active low, enables redundant write driver 64.

A sense-amp/write-driver enable circuit 66 generates the active levels of RSAE and $\overline{RWDE}$ in response to an active level, here logic 0, of a signal $\overline{\text{SENSE AMP WRITE DRIVER ENABLE}}$ ($\overline{SAWDE}$) on line 68 generated by the bit-line selector 24 associated with the selected redundant column 18. All bit-line selectors 24 have their $\overline{SAWDE}$ outputs wired-logic connected to line 68. Enabler 66 also receives $\overline{READ}$ and $\overline{WRITE}$ signals, which indicate the data transfer to be performed and thus the signal RSAE or $\overline{RWDE}$ enabler 66 is to generate. Each bit-line selector 24 generates an active level for $\overline{SAWDE}$ whenever its associated redundant column 18 is enabled. Circuit 66 includes a driver 70, which in response to a an active high signal WRITE SENSE AMP PRECHARGE (WSAP) from controller 26, precharges line 68 to an inactive level, here logic 1, during the interval when ECA is invalid. The precharging of line 68 provides the advantages as described above.

Figure 4:
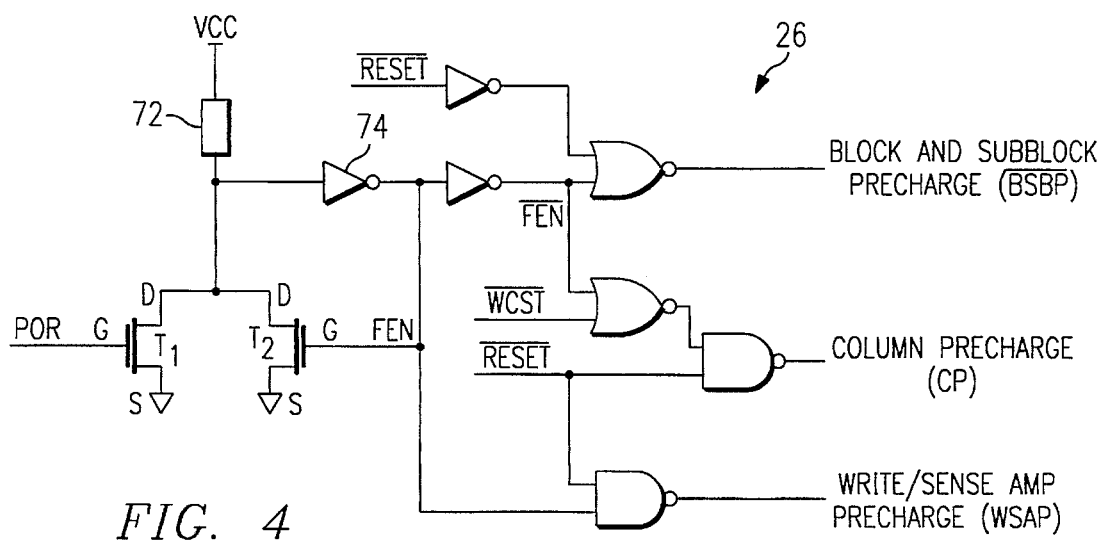
FIG. 4 is a circuit diagram of the precharge controller of FIG. 3.

FIG. 4 is a circuit diagram of precharge controller 26 of FIG. 3. Circuit 26 includes a fuse 72 coupled between the drains D of N-channel MOSFET transistors T1 and T2 and power-supply voltage Vcc, which is approximately 5 volts in one aspect of the invention. Fuse 72 is normally unblown, i.e., short circuited, except when a redundant column 18 with which circuit 26 is associated is mapped to a defective column 16. That is, fuse 72 is blown if one of the redundant columns 18 associated with circuit 26 is selected for mapping to a defective column 16. If a circuit 26 is associated with only one redundant column 18 (which is typically the case), then fuse 72 is blown only if that column 18 is selected for mapping to a defective column 16. Controller 26 includes other logic circuitry as discussed below for generating signals $\overline{BSBP}$, CP, and $\overline{WSAP}$.

At power up, POR goes active high. If fuse 72 is blown, then T1 saturates and drives the drains D of T1 and T2 low. Inverter 74 then maintains a high level at the gate of T2. This positive feedback loop formed by T2 and inverter 74 maintains the drains of T1 and T2 at logic low and keeps signal FUSE ENABLE (FEN) active high even after POR goes inactive low a predetermined time after power up. Thus, fuse 72 is blown to enable circuit 20 to map a redundant column or columns 18 to a defective column or columns 16. Alternately, POR may be eliminated, and leakage currents through T1 and T2 will drive their drains D to a logic low. If fuse 72 remains closed i.e., unblown, T1 is designed such that even when POR is active high, T1 cannot sink enough current to drive the drains of T1 and T2 to logic 0. Thus, FEN is inactive low, and the feedback loop maintains FEN at an inactive low level. Thus, circuit 20 is disabled, and does not map a redundant column 18 to the address of a defective column 16.

Circuit 26 generates signals $\overline{BSBP}$, WSAP, and CP with the illustrated logical combinations of FEN, $\overline{WCST}$, and RESET. $\overline{WCST}$ maintains CP active high until ECA (FIGS. 2 and 3) is valid and $\overline{RCA}$ (FIG. 3) is stable.

Figure 5:
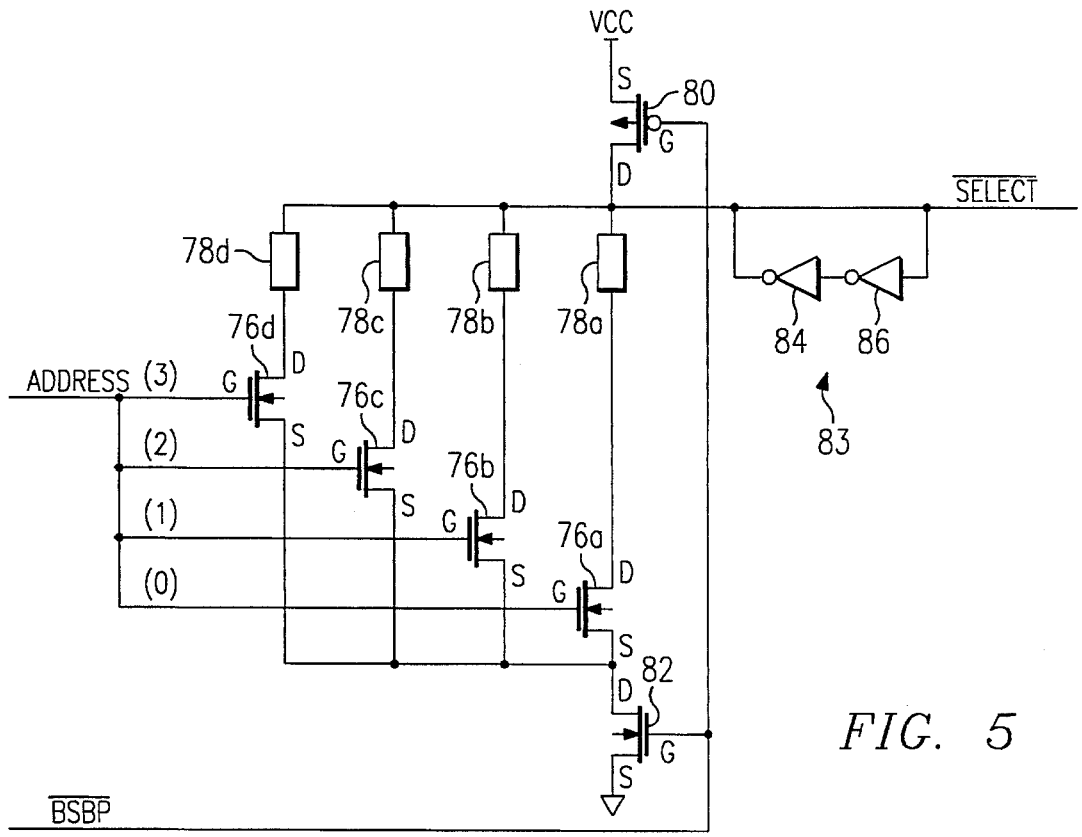
FIG. 5 is a circuit diagram of the block and relative-subblock selectors of FIG. 3.

FIG. 5 is a circuit diagram of both block selector 38 and subblock selector 40 of FIG. 3. When the FIG. 5 circuit is used for block selector 38, BA is the ADDRESS signal, and $\overline{BS}$ is the $\overline{SELECT}$ signal. When the FIG. 5 circuit is used as subblock selector 40, RSBA is ADDRESS, and $\overline{SBS}$ is $\overline{SELECT}$. As shown, ADDRESS includes four bits 0–3, which each drive the gate of a corresponding N-channel MOS transistor 76a–d. The drains of transistors 76 are each respectively connected to a fuse 78a–d. A P-channel MOS transistor 80, which is coupled between Vcc and fuses 78, composes driver 46 or 50, depending upon whether the FIG. 5 circuit is used as block selector 38 or subblock selector 40. An N-channel transistor 82 is coupled between the sources of transistors 76 and ground.

In operation, signal $\overline{BSBP}$, which is coupled to the gates of transistors 80 and 82, goes active low during the address-invalid interval, and thus turns on transistor 80, which drives, i.e., precharges, the SELECT line (either 44 or 48) to an inactive high level. A weak latch 83 including inverters 84 and 86 maintains this inactive high level on the SELECT line until it is driven otherwise. Signal $\overline{BSBP}$ concurrently turns off transistor 82, and thus prevents any of transistors 76 from conducting to ground.

None of the fuses 78 of the FIG. 5 circuit are blown if the redundant column 18 with which the circuit is associated is not mapped to a defective column 16. However, if the associated redundant column 18 is so mapped, then the FIG. 5 circuit is programmed by blowing all fuses 78 but one. The closed fuse 78 corresponds to the block 12 or subblock therein that includes the defective column 16.

When ECA (FIGS. 2 and 3) becomes valid, i.e., when $\overline{BSBP}$ goes inactive high, the ADDRESS bit corresponding to the addressed block or subblock position is active high, thus activating the transistor 76 to which it is coupled. If the fuse 78 coupled to the activated transistor 76 is blown, then the activated transistor 76 cannot conduct, and SELECT remains inactive high. However, if the fuse 78 associated with the activated transistor 76 is closed, then the activated transistor 76 conducts current from the SELECT line via the closed fuse 78 and turned-on transistor 82. Because transistor 80 is now turned off, the active transistor 76 draws sufficient current to overcome the effect of weak latch 83 and drives SELECT to an active low level. This active low level indicates that the particular block or subblock position therein to which the associated redundant column 18 has been mapped is being addressed by ECA.

Because transistor 80 precharges $\overline{SELECT}$ during the relatively long address-invalid interval, it can operate substantially more slowly than transistors 76, which operate only during the address-valid interval. In existing devices, transistors 76 and 80 are "balanced" to provide the same speed characteristics. Thus, precharging allows the design requirements of transistor 80 to be relaxed. Also, transistor 80 can be located farther away from line $\overline{\text{SELECT}}$ than transistors 76, since the increased speed degradations caused by line and other parasitic capacitances typically do not cause the time required by transistor 80 to precharge the $\overline{\text{SELECT}}$ line to exceed the address-invalid interval. Furthermore, only one transistor 80 is needed to precharge the select line, whereas existing devices require at least four transistors 80, i.e., a corresponding transistor 80 to form a complementary, i.e., push-pull, transistor pair with each transistor 76a–d. As discussed above, this flexibility in location and the reduced number of transistors 80 often greatly reduce the area of memory device 10.

Figure 6:
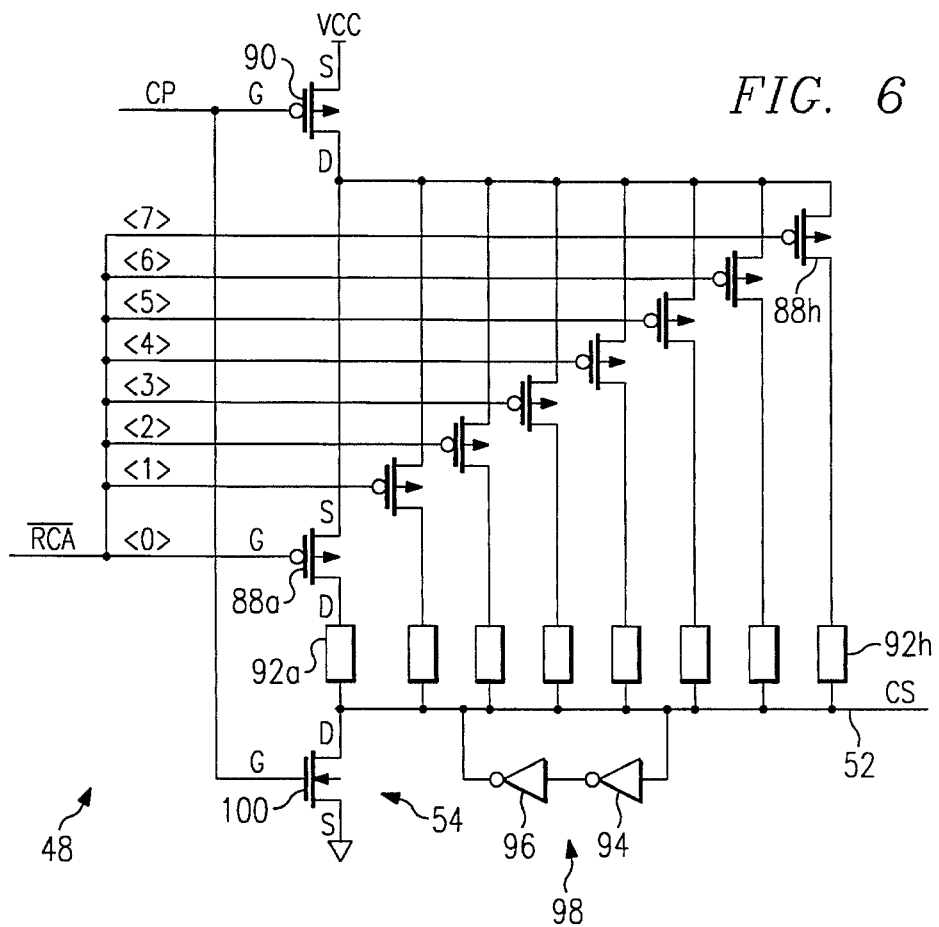
FIG. 6 is a circuit diagram of the relative-column selector of FIG. 3.

FIG. 6 is a circuit diagram of column selector 42 of FIG. 3. Column selector 42 operates similarly to both block and subblock selectors 38 and 40. $\overline{\text{RCA}}$ includes eight bits 0–7, which are respectively coupled to the gates of eight P-channel transistors 88a–h. The sources of transistors 88 are coupled to P-channel transistor 90, the source of which is coupled to Vcc and the gate of which is coupled to CP. The drains of transistors 88 are respectively coupled to fuses 92a–h, which are coupled to CS line 52. Inverters 94 and 96 compose a weak latch 98 that is coupled to line 52. An N-channel transistor 100 having its drain coupled to line 50, its gate coupled to CP, and its source coupled to ground composes precharge driver 54.

In operation, no fuses 92 are blown if the redundant column 18 with which circuit 48 is associated is not mapped to a defective column 16. If, however, the associated redundant column 18 is mapped to a defective column 16, circuit 48 is programmed by blowing all fuses 92 except one. This closed fuse 92 corresponds to the relative column location of the defective column 16 within its particular block 12 and subblock 14.

As discussed above, during the address-invalid interval, i.e., the precharge interval, signal CP is active high. Thus, signal CP turns on transistor 100, which draws current from line 52. CP also turns off transistor 90, which prohibits current flow from the power supply to line 52. Thus, transistor 100 saturates and drives, i.e., precharges, CS line 52 to an inactive low level. Weak latch 98 maintains this low level until line 50 is driven to another level.

At some predetermined time after ECA becomes valid, signal CP goes inactive low, thus turning on transistor 90. The bit 0–7 of $\overline{\text{RCA}}$ corresponding to the relative column location of the addressed defective column 16 is active low, thus turning on the transistor 88 to which it is coupled. If the associated fuse 92 remains closed, CS on line 50 is driven to an active high level, thus indicating that the relative column location to which the associated redundant column 18 is mapped has been addressed. Precharging provides the same advantages with respect to transistor 100 as discussed above with respect to transistor 80 (FIG. 5).

Figure 7:
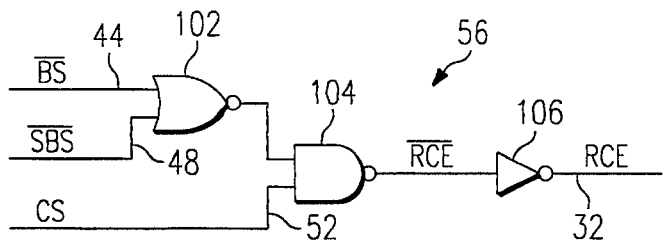
FIG. 7 is a circuit diagram of the redundant-column enabler of FIG. 3.

FIG. 7 is a circuit diagram of the redundant column enabler 56 of FIG. 3. As shown, the combination of NOR gate 102, NAND gate 104, and inverter 106 effectively performs an AND logic function such that only when active signal levels are concurrently on lines 44, 48, and 52 does circuit 56 generate an active high level on RCE line 32. As discussed above, an active level for signal RCE enables the associated redundant column 18 and the mapping thereof to the desired bit line of DATA.

Figure 8:
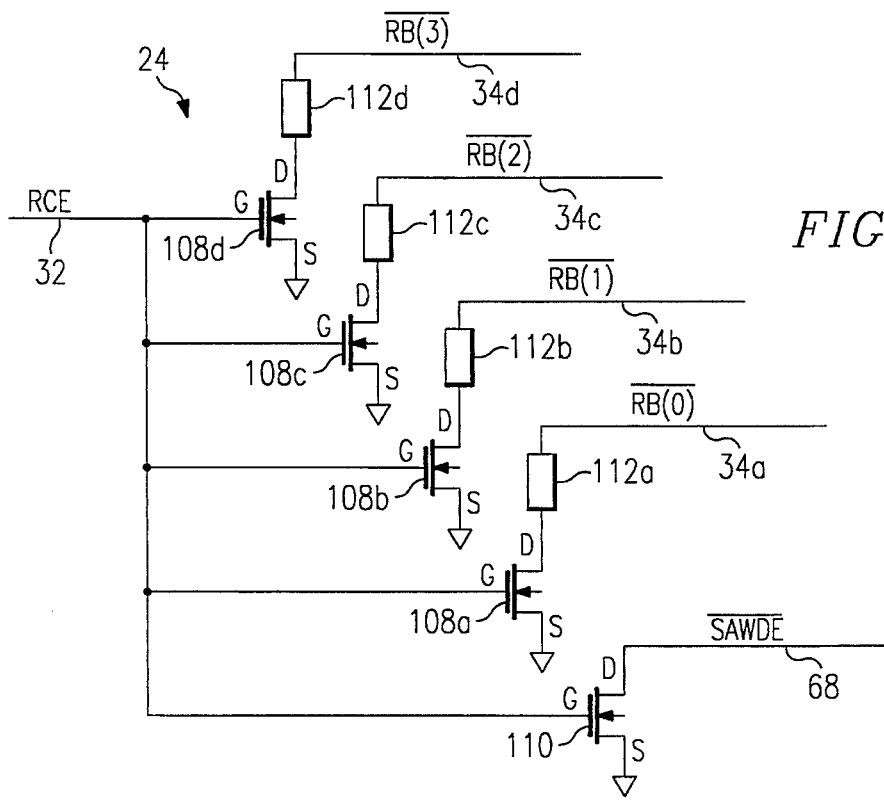
FIG. 8 is a circuit diagram of the bit-line selector of FIG. 3.

FIG. 8 is a circuit diagram of a bit-line selector 24 of FIG. 3. As shown, RCE line 32 is coupled to the gates of four N-channel transistors 108a–d and an N-channel transistor 110. The sources of transistors 108 and 110 are coupled to ground. The drains of transistors 108a–d are respectively coupled to fuses 112a–d. The opposite ends of fuses 112 are coupled to bit-select lines 34a–d of bus $\overline{\text{BIS}}$ of FIG. 3. As stated above, the fuses 112 of other associated circuits 24 are also coupled to lines 34a–d to form a wired logic connection, here a wired NOR connection of all associated circuits 24, i.e., all circuits 24 coupled to lines 34a–d of the BIS bus. In other aspects of the invention, circuits 24 may be coupled to lines 34a–d to form other wired logic connections, such as wired OR or wired AND connections. Such a wired logic connection eliminates the requirement of existing circuits that an RCE signal for each redundant column 18 be routed to a central decoder. Such elimination greatly reduces the layout complexity and area of the memory device 10.

In operation, when a redundant column 18 is selected to be mapped to the address of a defective column 16, the circuit 24 associated with the selected redundant column 18 is programmed to map the selected column 18 to a desired one of the DATA bit lines that communicates with the particular block 12 that includes the defective column 16. Circuit 24 is programmed by blowing all the fuses except the fuse coupled to the bit-select line 34 that corresponds to the desired DATA bit line.

For example, suppose the selected redundant column 18 is mapped to a column 16 residing in a block 12 that supplies DATA bits 0–3. To map the redundant column 18 to DATA bit line 2, fuses 112a, 112b, and 112d are blown, and fuse 112c remains intact or closed. Thus, when RCE line 32 carries an active high level, transistor 108c is turned on, and through intact fuse 112c drives line 34c active low. This active low level on line 34c indicates to interface 28 (FIG. 3) to couple the selected memory cell 19 from the selected redundant column 18 to bit line DATA (2).

Transistor 110 also conducts in response to the active high on RCE line 32, and thus drives $\overline{\text{SAWDE}}$ on line 68 active low to enable circuit 66 of FIG. 3. The drain of transistor 110 is directly coupled to line 68, i.e., no fuse separates the drain of transistor 110 and line 68, because transistor 110 drives line 68 active low whenever RCE is active high. That is, no matter what DATA bit line is selected, signal $\overline{\text{SAWDE}}$ is driven active to enable reading or writing between the selected DATA bit line and the selected memory cell 19 within the enabled redundant column 18.

For a y=18-bit memory device 10 as discussed above, bus $\overline{\text{BIS}}$ includes five bit-select lines 0–4, and circuit 24 includes an additional transistor 108e and fuse 112e coupled between ground, RCE, and a bit-select line 34e (not shown).

Figure 9:
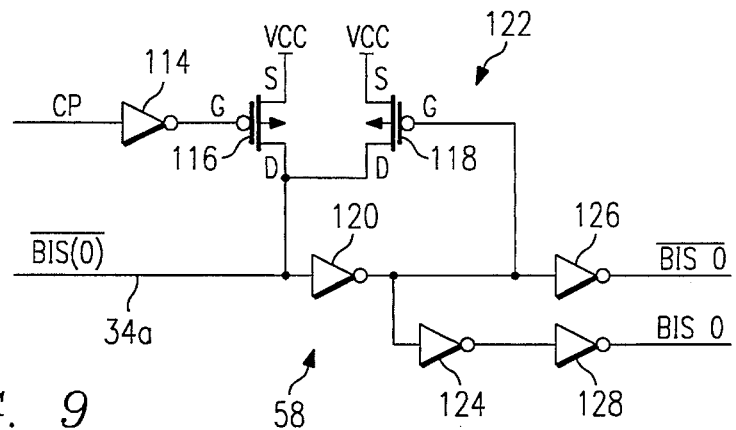
FIG. 9 is a circuit diagram of a portion of the precharge driver of FIG. 3 that precharges the bit-select bus.

FIG. 9 is a circuit diagram of the portion of driver 58 that precharges line 34a. The structure and operation of the remaining portions that precharge lines 34b–d are similar to the illustrated portion. Also, because of the wired NOR relationship between bit-line selector 24 and lines 34, there may be only one bus $\overline{\text{BIS}}$ per circuit 20. Thus, only one driver 58 is needed for each circuit 20. As shown, CP is coupled to an inverter 114 having its output coupled to the gate of a P-channel transistor 116. The source of transistor 116 is coupled to Vcc, and its drain is coupled to line 34a and the drain of another P-channel transistor 118. An inverter 120 is coupled between line 34a and the gate of transistor 118. Transistor 118 and inverter 120 form a weak latch 122. Inverters 124, 126 and 128 convert signal $\overline{\text{BIS}}(0)$ on line 34a to complementary signals $\overline{\text{BIS}}(0)$ and BIS(0).

In operation, during the precharge interval, signal CP goes active high and inverter 114 drives the gate of transistor 116 low, thus turning on transistor 116 and coupling voltage Vcc, i.e., an inactive high logic level, to line 34*a*. Inverter 120 drives the gate of transistor 118 low, and thus weak latch 122 maintains the inactive high level on line 34*a* even after signal CP goes inactive low. (During the time CP is active high, RCE is inactive low.) Thus, the inactive high level on line 34*a* remains until a redundant column 18 associated with one of the bit-line selectors 24 coupled to line 34*a* and mapped to the bit line associated with BIS(0) is addressed. When such addressing occurs, line 34*a* is driven active low by transistor 108*a* (FIG. 8) as described above. Thus, complementary signals $\overline{BIS(0)}$ and BIS(0) are driven active low and active high, respectively.

As discussed above in relation to transistor 80 of FIG. 5, precharge components 114, 116, and 118, which together compose a portion of driver 58 of FIG. 3, can be located so as to reduce the routing and layout complexity of device 10. Also, only one each of components 114, 116, and 118 are needed for each BIS line 34. If precharging were not used, at least four transistors 116 would be required for each circuit 24 to form complementary pairs with transistors 108 (FIG. 8).

Figure 10:
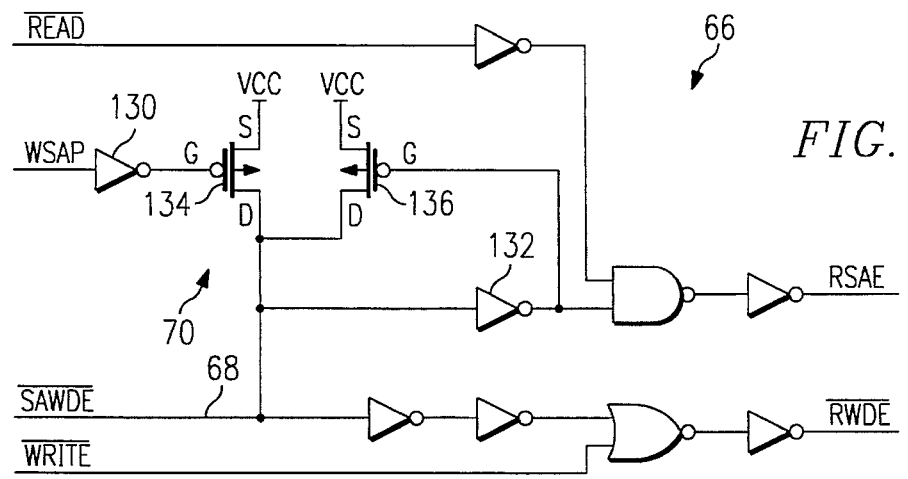
FIG. 10 is a circuit diagram of the sense-amp/write-driver enabler of FIG. 3.

FIG. 10 is a circuit diagram of the sense-amp write-driver enable circuit 66 of FIG. 3. Circuit 66 includes logic that generates RSAE and $\overline{RWDE}$. Circuit 66 drives RSAE active high when $\overline{READ}$ and $\overline{SAWDE}$ are both active low, and drives $\overline{RWDE}$ active low when $\overline{SAWDE}$ and $\overline{WRITE}$ are both active low. Circuit 66 also includes precharge driver 70, which includes inverters 130 and 132 and transistors 134 and 136. As discussed above for similar drivers 46, 50, 54, and 58, inverter 132 and transistor 136 form a weak latch that maintains $\overline{SAWDE}$ on line 68 at an inactive high level until circuit 24 drives $\overline{SAWDE}$ active low. Furthermore, driver 70 eliminates the need for an addition P-channel transistor in each circuit 24 to complement transistor 110 (FIG. 8).

Figure 11A:
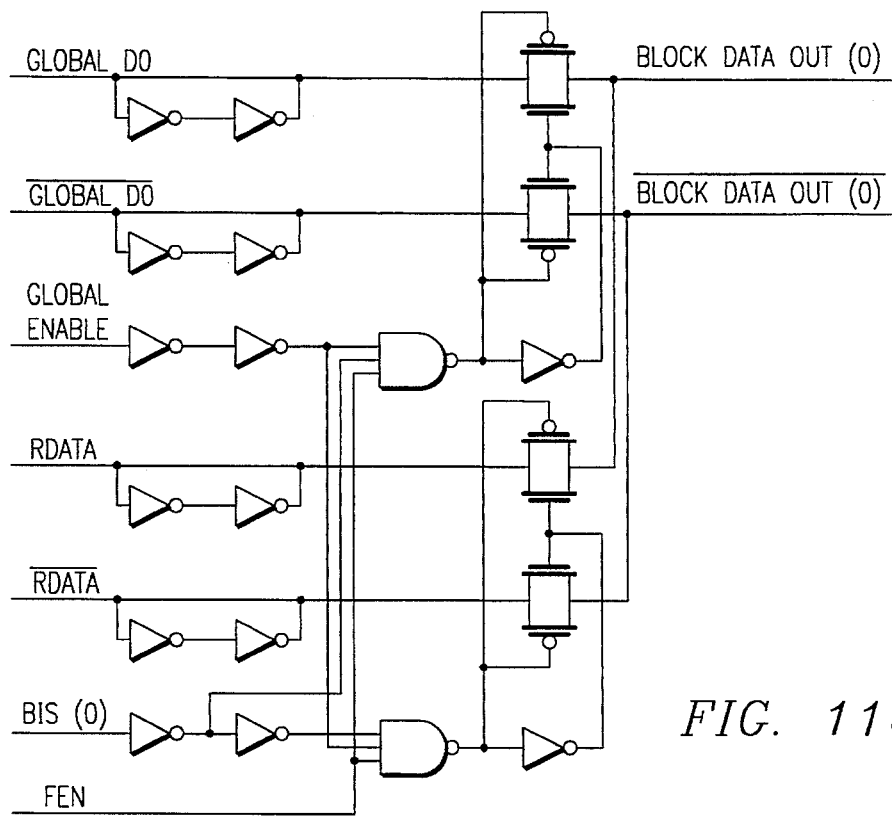
FIG. 11a is a circuit diagram of a first portion of the redundant-bus-to-bit-line coupler of FIG. 3.

FIG. 11*a* is a partial circuit diagram of a read portion of multiplexer 59 in FIG. 3 that couples data from redundant sense amp 62 to the selected bit line of BLOCK DATA OUT during a read of memory device 10. For clarity, only the portion of multiplexer 59 associated with bit-select line $\overline{BIS(0)}$ and bit line BLOCK DATA OUT(0) is shown. Circuits similar in structure and operation are associated with bit-select lines $\overline{BIS}$(1–3) and bit lines BLOCK DATA OUT(1–3). In the illustrated aspect of the invention, bus RDATA composes complementary lines RDATA and $\overline{RDATA}$.

In operation, when both signals $\overline{BIS(0)}$ and FEN are active, complementary data lines GLOBAL DO and $\overline{GLOBAL\ DO}$ which are coupled to the array of memory cells 16 (FIG. 1), are decoupled from complementary lines BLOCK DATA OUT(0) and $\overline{BLOCK\ DATA\ OUT(0)}$, which are instead respectively coupled to complementary lines RDATA and $\overline{RDATA}$. As stated above, this coupling and decoupling is transparent to the external circuitry, which is "unaware" that this particular data operation is being directed to a redundant column 18 instead of an array column 16.

Figure 11B:
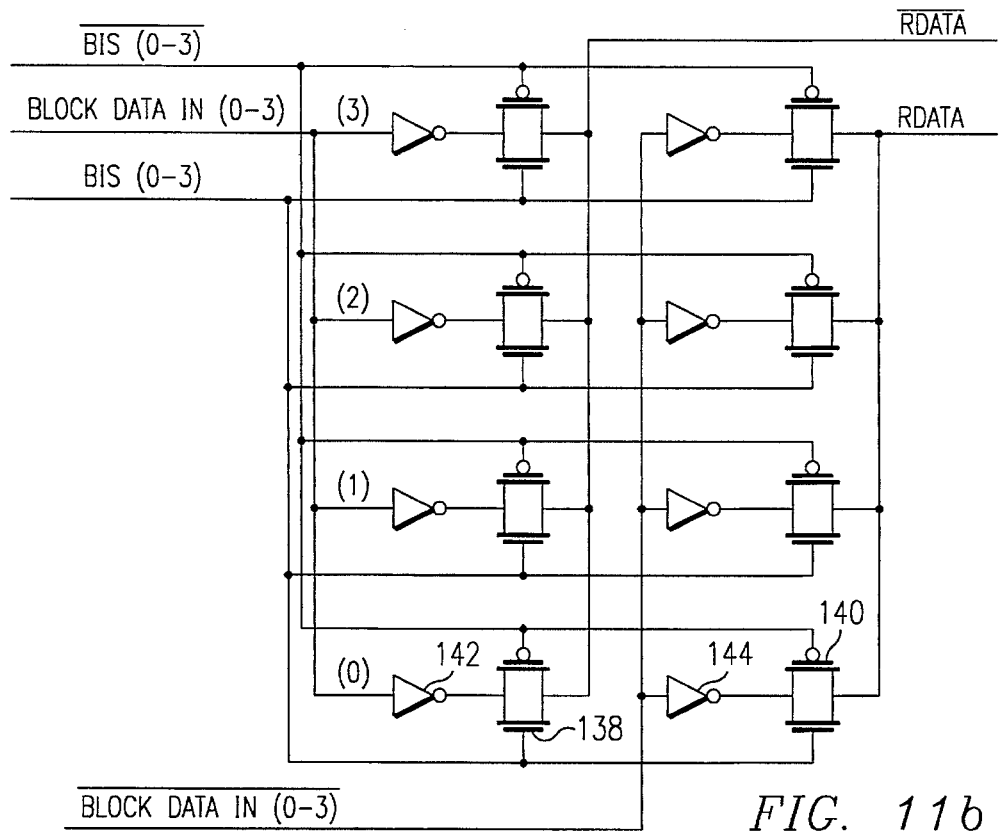
FIG. 11b is a circuit diagram of a second portion of the redundant-bus-to-bit-line coupler of FIG. 3.

FIG. 11*b* is a circuit diagram of a write portion of multiplexer 59 for coupling selected complementary bit lines BLOCK DATA IN and $\overline{BLOCK\ DATA\ IN}$ to the complementary bit lines RDATA and $\overline{RDATA}$ during a write operation. Here, the circuitry associated with all the bit-select lines 34 of $\overline{BIS}$ and all the bit lines of BLOCK DATA IN is shown.

In operation, for example, when BLOCK DATA IN(0) is selected, the active levels of BIS(0) and $\overline{BIS(0)}$ close switches 138 and 140, which couple complementary bit lines BLOCK DATA IN(0) and $\overline{BLOCK\ DATA\ IN(0)}$ to RDATA and $\overline{RDATA}$ respectively.

From the foregoing, it will be evident that although specific embodiments have been described herein for the purpose of illustrating the invention, various modifications may be made without deviating from the spirit and scope of the invention. For example, although programming is described as leaving a selected element (fuse) conducting, other aspects of the invention may include devices that are programmed by making the selected element nonconducting. Furthermore, the present invention contemplates programming components and methods other than fuses and the use thereof.

What is claimed is:

1. Apparatus for mapping a redundant memory column having a redundant memory cell to an address of a defective memory column in a memory device that communicates with an external address bus and an external data bus having one or more data-bit lines, comprising:

an enable line in communication with said redundant memory column and operable to carry first active and inactive signal levels for respectively enabling and disabling communication between said data bus and said redundant memory cell;

an address decoder operable to receive an address signal on said address bus and to generate said active level on said enable line when the value of said address signal equals said address; and a first driver operable to precharge said enable line to said inactive level while said address signal is invalid.

2. The apparatus of claim 1, further comprising:

a redundant data bus in communication with said redundant memory column;

an interface circuit in communication with said external and redundant data busses, and, in response to said active level on said enable line, operable to couple said memory location to a desired one of said data-bit lines via said redundant data bus.

3. The apparatus of claim 2, further comprising:

a bit-select bus in communication with said interface circuit and having one or more bit-select lines each associated with one of said data-bit lines, each of said bit-select lines operable to carry second active and inactive levels;

a data-bit line selector in communication with said bit-select bus and operable to generate said second active level on a bit-select line associated with said desired data-bit line in response to said first active level on said enable line.

4. The apparatus of claim 3, further comprising said first driver for precharging said bit-select lines to said second inactive level when said address signal is invalid.

5. The apparatus of claim 3, further comprising a second driver for precharging said bit-select lines to said second inactive level when said address signal is invalid.

6. The apparatus of claim 3 wherein said first active and inactive levels are respectively equivalent to said second active and inactive levels.

7. The apparatus of claim 1, further comprising a precharge controller for generating a precharge control signal when said address signal is invalid to control said first driver.

8. A circuit for mapping a redundant memory column having a redundant memory cell to an address of a defective memory column having block, relative-subblock, and relative-column addresses, said circuit in a memory device in communication with an external data bus having a plurality of data-bit lines and an address bus, comprising:

a block select line operable to carry block active and inactive signal levels;

a block selector in communication with said block select line and operable to generate said block active level on said block select line when the value of a block address signal equals said block address of said defective memory column;

a relative-subblock select line operable to carry subblock active and inactive signal levels;

a relative-subblock selector in communication with said subblock select line and operable to generate said subblock active level on said subblock select line when the value of a relative-subblock address signal equals said relative-subblock address of said defective memory column;

a relative-column select line operable to carry column active and inactive signal levels;

a relative-column selector in communication with said relative-column select line and operable to generate said column active level on said relative-column select line when the value of a relative-column address signal equals said relative-column address of said defective memory column;

a driver for precharging said block, relative-subblock, and relative-column select lines respectively to said block, —subblock, and column inactive levels before said block, relative-subblock and relative-column address signals become valid; and a redundant-column enabler in communication with said block, relative-subblock, and relative-column select lines and operable to generate a redundant-column enable signal to enable communication between a selected one of said memory cells and said external data bus when said block, relative-subblock, and relative-column select lines concurrently carry said block, relative-subblock and relative-column active levels respectively.

9. The circuit of claim 8 wherein said driver comprises:

a block driver for precharging said block select line;

a subblock driver for precharging said relative-subblock select line; and a column driver for precharging said relative-column select line.

10. The circuit of claim 9 wherein said block, relative-subblock, and relative-column selectors respectively include said block, subblock, and column drivers.

11. The circuit of claim 8 wherein said block, subblock, and column active and inactive levels are respectively equivalent.

12. The circuit of claim 8, further comprising a precharge controller operable to generate control signals for controlling said driver.

13. The circuit of claim 8 wherein said block, relative-subblock, and relative-column selectors are programmable.

14. The circuit of claim 8, further comprising:

a redundant data bus in communication with said redundant memory column;

an interface circuit in communication with said redundant data bus, and, in response to said redundant column enable signal, operable to couple said selected memory location to a selected one of said data-bit lines via said redundant data bus.

15. The circuit of claim 14, further comprising:

a bit-select bus in communication with said interface circuit and having a plurality of bit-select lines each associated with one of said data-bit lines, each of said bit-select lines operable to carry bit-select active and inactive signal levels;

a data-bit line selector in communication with said bit-select bus and operable to generate said bit-select active level on a bit-select line associated with said selected data-bit line in response to said redundant column enable signal.

16. The circuit of claim 15, further comprising said driver for precharging said bit-select lines to said bit-select inactive level before said block, relative-subblock, and relative-column address signals become valid.

17. The circuit of claim 15, further comprising a second driver for precharging said bit-select lines to said bit-select inactive level before said block, relative-subblock, and relative-column address signals become valid.

18. The circuit of claim 15, further comprising:

a sense-amp/write-driver enable line operable to carry sense amp/write driver active and inactive signal levels;

said data-bit line selector operable to generate said sense-amp/write-driver active level on said sense-amp/write-driver enable line in response to said redundant-column enable signal;

a redundant sense amplifier operable to couple data from said redundant data bus to said selected bit line in response to a sense amp enable signal;

a redundant write driver operable to couple data from said selected bit line to said redundant data bus in response to a write driver enable signal; and a sense-amp/write-driver enabler in communication with said sense-amp/write-driver enable line and operable to generate said sense amp and said write driver enable signals in response to said sense-amp/write-driver active level on said sense-amp/write-driver enable line.

19. The circuit of claim 18 wherein said driver is operable to precharge said sense-amp/write-driver enable line to said sense-amp/write-driver inactive level before said block, relative-subblock, and relative-column address signals become valid.

20. The circuit of claim 19 wherein said driver comprises a second driver for precharging said sense-amp/write-driver enable line.

21. The circuit of claim 20 wherein said sense-amp/write-driver enabler includes said second driver.

22. The circuit of claim 18, further comprising a number of data-bit line selectors each operable to generate said sense-amp/write-driver active level on said sense-amp/write-driver enable line in response to an associated one of said number of redundant column enable signals such that said sense-amp/write-driver active level is generated when one or more of said redundant column enable signals is generated.

23. The circuit of claim 15 wherein said bit-line selector is programmable.

24. The circuit of claim 15 wherein said data-bit line selector comprises a plurality of fuses each coupled to a corresponding one of said bit-select lines, wherein said selector is programmed by blowing all of said fuses except the fuse coupled to said bit-select line associated with said selected data-bit line.

25. The circuit of claim 15, further comprising multiple data-bit line selectors in communication with said bit-select bus and each operable to receive an associated redundant column enable signal and to generate said bit-select active level on a bit-select line associated with a selected data-bit line in response to said associated redundant column enable signal.

26. The circuit of claim 8, further comprising an address separator operable to receive an external column address signal on said address bus and to generate therefrom said block, relative-subblock, and relative-column address signals.

27. Method for mapping a redundant memory column having a redundant memory cell to an address of a defective memory column, comprising:

receiving an address signal;

precharging an enable line to an enable inactive signal level when said address signal is invalid to disable communication between a data bus and said redundant memory cell; and generating an enable active signal level on said enable line when said address signal is valid if the value of said address signal equals said address to enable communication between said data bus and said redundant memory cell.

28. The method of claim 27, further comprising coupling via a redundant data bus said redundant cell to a desired one of a plurality of data-bit lines composing said external data bus in response to said active signal level on said enable line.

29. The method of claim 28, further comprising generating a bit-select active signal level on a bit-select line associated with said desired data-bit line in response to said enable active level on said enable line.

30. The method of claim 29, further comprising precharging said bit-select line to a bit-select inactive signal level when said address signal is invalid.

31. The method of claim 27, further comprising generating a precharge control signal for controlling said precharging of said enable line.

* * * * *